(12) United States Patent
Srinivasan et al.

(10) Patent No.: US 10,564,195 B2
(45) Date of Patent: Feb. 18, 2020

(54) SYSTEM AND METHOD FOR ENERGY SAMPLE FORECASTING OF HVAC-R SYSTEMS

(71) Applicant: Tata Consultancy Services Limited, Mumbai (IN)

(72) Inventors: Shravan Srinivasan, Chennai (IN); Arunchandar Vasan, Chennai (IN); Venkatesh Sarangan, Chennai (IN); Anand Sivasubramaniam, Chennai (IN)

(73) Assignee: Tata Consultancy Services Limited, Mumbai (IN)

( * ) Notice: Subject to any disclaimer, the term of this patent is extended or adjusted under 35 U.S.C. 154(b) by 978 days.

(21) Appl. No.: 15/057,821

(22) Filed: Mar. 1, 2016

(65) Prior Publication Data

US 2017/0017735 A1 Jan. 19, 2017

(30) Foreign Application Priority Data

Jul. 13, 2015 (IN) .......................... 2636/MUM/2015

(51) Int. Cl.
*G01R 22/06* (2006.01)
(52) U.S. Cl.
CPC .................................. *G01R 22/061* (2013.01)
(58) Field of Classification Search
None
See application file for complete search history.

(56) References Cited

U.S. PATENT DOCUMENTS

| | | | | |
|---|---|---|---|---|
| 8,370,283 | B2 * | 2/2013 | Pitcher | G06F 17/5009 703/2 |
| 2004/0102937 | A1 | 5/2004 | Ibrahim | |
| 2016/0377309 | A1 * | 12/2016 | Abiprojo | G05B 19/042 700/276 |

FOREIGN PATENT DOCUMENTS

| | | | | |
|---|---|---|---|---|
| WO | WO-2013090026 A2 * | 6/2013 | | G01D 4/002 |
| WO | WO-2014172389 A1 * | 10/2014 | | G05B 15/02 |

OTHER PUBLICATIONS

Yan et al. "ARX model based fault detection and diagnosis for chillers using support vector machines", Energy and Buildings 81, pp. 287-295. (Year: 2014).*

(Continued)

*Primary Examiner* — Suzanne Lo
(74) *Attorney, Agent, or Firm* — Finnegan, Henderson, Farabow, Garrett & Dunner LLP (57) ABSTRACT

A technique for energy sample forecasting of heating, venting and air conditioning-refrigeration (HVAC-R) systems is disclosed. In an example, a first expected energy sample of a HVAC-R system at a first time period is forecasted by modelling actual energy samples of the HVAC-R system at previous time periods using a statistically-based seasonal-autoregressive integrated moving average (SARIMA) model. Further, an anomaly is detected at the first time period when deviation between the first expected energy sample and an actual energy sample at the first time period is greater than a dynamic context sensitive threshold. Also, an expected energy sample at next time period is forecasted by modelling a second expected energy sample of the HVAC-R system at the first time period using the statistically-based SARIMA model upon detecting anomaly. The second expected energy sample is forecasted by modelling the actual energy samples at the previous time periods using a physical model.

12 Claims, 5 Drawing Sheets

(56) References Cited

OTHER PUBLICATIONS

Yamaguchi, A. et al., "Wind Power Forecasting by using Physical and Statistical Approach", Department for Civil Engineering School of Engineering, The University of Tokyo, http://windeng.t.u-tokyo.ac.jp/ishihara/rpoceedings/2010-2_poster.pdf, (2010).

Yan, K. et al., "ARX Model Based Fault Detection and Diagnosis for Chillers using Support Vector Machines", Department of Engineering Systems and Management, Masdar Institute of Science and Technology, http://www.wshen.net/paper/Yan_et_al.pdf, pp. 1-34, (2014).

* cited by examiner

SYSTEM AND METHOD FOR ENERGY SAMPLE FORECASTING OF HVAC-R SYSTEMS

PRIORITY CLAIM

This U.S. patent application claims priority under 35 U.S.C. § 119 to: India Application No. 2636/MUM/2015, filed on Jul. 13, 2015. The entire contents of the aforementioned application are incorporated herein by reference.

TECHNICAL FIELD

The embodiments herein generally relate to heating, venting and air conditioning-refrigeration (HVAC-R) systems, and, more particularly, to energy sample forecasting of the HVAC-R systems.

BACKGROUND

Energy sample forecasting is an important function for most facilities. Whether large or small, most facilities include devices that utilize energy, such as heating, venting and air conditioning-refrigeration (HVAC-R) systems and the like. The amount of energy utilized by such systems may vary depending on external factors, such as the severity and degree of outside air temperature (hot or cold), a type of weather pattern being experienced, internal load, need for running multiple systems in the facility, and so on.

Since energy usage can vary significantly depending on such internal and external factors, it is beneficial for the facilities to be able to anticipate future energy usage so that the energy usage can be managed. In conventional methods to model energy consumption, dynamics of control system(s) of a HVAC-R system is captured, evolution of control system states are tracked, and then the system states are mapped to the energy consumption. However, control choices in the control systems are typically proprietary and tuned locally to a facility by an installation vendor. Even if the system states can be tracked in terms of the controlled variables, it may be difficult to calibrate such a control system model (which runs every few seconds) from sensor information that is typically logged every few minutes. In some cases, sensors for detecting the information may not be available in the facilities.

SUMMARY

Embodiments of the present disclosure present technological improvements as solutions to one or more of the above-mentioned technical problems recognized by the inventors in conventional systems. In view of the foregoing, embodiments herein provides a technique for energy sample forecasting of heating, venting and air conditioning-refrigeration (HVAC-R) systems.

In an embodiment, a method for energy sample forecasting of a HVAC-R system is disclosed. In an embodiment, a first expected energy sample of the HVAC-R system at a first time period is forecasted by modelling actual energy samples of the HVAC-R system at previous time periods using a statistically-based seasonal-autoregressive integrated moving average (SARIMA) model. Further, the first expected energy sample is compared with an actual energy sample at the first time period. Furthermore, an anomaly is detected at the first time period when deviation between the first expected energy sample and the actual energy sample is greater than a dynamic context sensitive threshold. Also, an expected energy sample of the HVAC-R system at next time period is forecasted by modelling a second expected energy sample of the HVAC-R system at the first time period using the statistically-based SARIMA model upon detecting the anomaly. For example, the second expected energy sample is an energy sample which is forecasted by modelling the actual energy samples at the previous time periods using a physical model.

In another embodiment, a system for energy sample forecasting of a HVAC-R system is disclosed. In this embodiment, the system includes a HVAC-R system having one or more sensors for detecting actual energy samples of the HVAC-R system. Further, the system includes a forecasting system communicatively coupled to the HVAC-R system via a communication network. Furthermore, the forecasting system includes one or more processors and a memory communicatively coupled to the processor(s). In addition, the memory includes an energy sample forecasting module to forecast a first expected energy sample of the HVAC-R system at a first time period by modelling the actual energy samples at the previous time periods using a statistically-based SARIMA model. The actual energy samples at the previous time periods of the HVAC-R system are obtained from the sensors.

Further, the energy sample forecasting module compares the first expected energy sample with an actual energy sample at the first time period. Furthermore, the energy sample forecasting module detects an anomaly at the first time period when deviation between the first expected energy sample and the actual energy sample is greater than a dynamic context sensitive threshold. In addition, the energy sample forecasting module forecasts an expected energy sample of the HVAC-R system at next time period by modelling a second expected energy sample of the HVAC-R system at the first time period using the statistically-based SARIMA model upon detecting the anomaly. The second expected energy sample is an energy sample that is forecasted by modelling the actual energy samples at the previous time periods using a physical model.

In yet another embodiment, a non-transitory computer readable medium embodying a program executable in a computing device is disclosed. In this embodiment, the program includes a program code for forecasting a first expected energy sample of a heating, venting and air conditioning-refrigeration (HVAC-R) system at a first time period by modelling actual energy samples of the HVAC-R system at previous time periods using a statistically-based seasonal-autoregressive integrated moving average (SA-RIMA) model. Further, the program includes a program code for comparing the first expected energy sample with an actual energy sample at the first time period. Furthermore, the program includes a program code for detecting an anomaly at the first time period when deviation between the first expected energy sample and the actual energy sample is greater than a dynamic context sensitive threshold. In addition, the program includes a program code for forecasting an expected energy sample of the HVAC-R system at next time period by modelling a second expected energy sample of the HVAC-R system at the first time period using the statistically-based SARIMA model upon detecting the anomaly, the second expected energy sample is an energy sample which is forecasted by modelling the actual energy samples at the previous time periods using a physical model.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this disclosure, illustrate exemplary embodiments and, together with the description, serve to explain the disclosed principles.

DETAILED DESCRIPTION

Exemplary embodiments are described with reference to the accompanying drawings. In the figures, the left-most digit(s) of a reference number identifies the figure in which the reference number first appears. Wherever convenient, the same reference numbers are used throughout the drawings to refer to the same or like parts. While examples and features of disclosed principles are described herein, modifications, adaptations, and other implementations are possible without departing from the spirit and scope of the disclosed embodiments. It is intended that the following detailed description be considered as exemplary only, with the true scope and spirit being indicated by the following claims.

Figure 1:
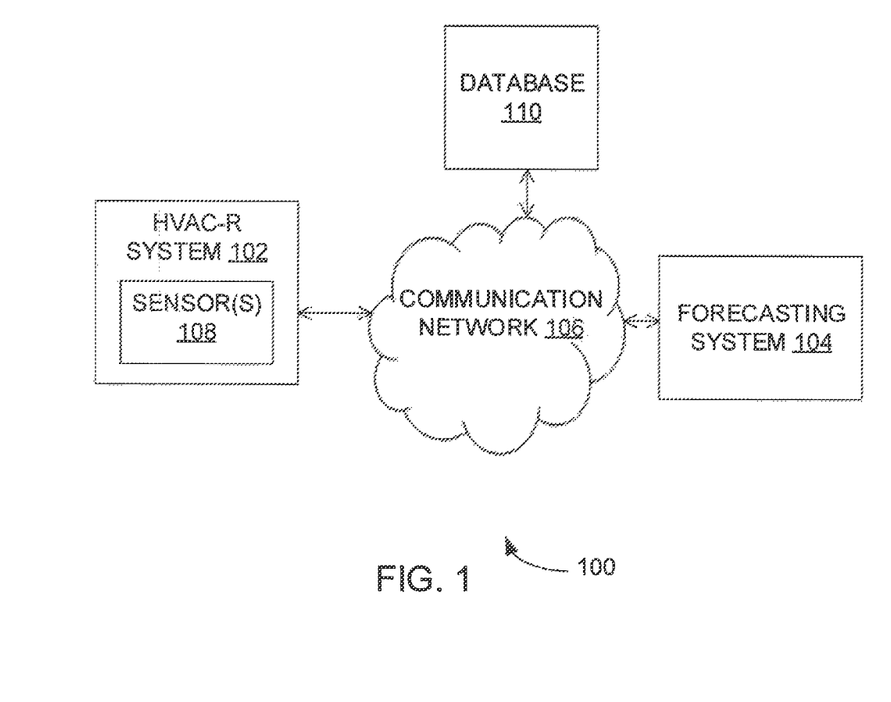
FIG. 1 illustrates a system for energy sample forecasting of a heating, venting and air conditioning-refrigeration (HVAC-R) system, according to some embodiments of the present disclosure.

Referring now to the drawings, and more particularly to FIGS. 1 through 4, where similar reference characters denote corresponding features consistently throughout the figures, there are shown preferred embodiments and these embodiments are described in the context of the following exemplary system and method FIG. 1 illustrates a system 100 for energy sample forecasting of a heating, venting and air conditioning-refrigeration (HVAC-R) system 102, according to some embodiments of the present disclosure. For example, the HVAC-R system 102 can be in a facility, such as a retail store and the like. As shown in FIG. 1, the system 100 includes the HVAC-R system 102 and a forecasting system 104 communicatively coupled to the HVAC-R system 102 via a communication network 106. Further, the HVAC-R system 102 include one or more sensor(s) 108 for detecting and sending actual energy samples of the HVAC-R system 102 at various time periods to the forecasting system 104. The sensor(s) 108 also detects and sends thermodynamic parameters and operational settings of the HVAC-R system 102 to the forecasting system 104. In some embodiments, the system 100 includes a database 110 coupled to the HVAC-R system 102 and the forecasting system 104 via the communication network 106. The database 110 may be used to store the actual energy samples of the HVAC-R system 102 at various time periods, the thermodynamic parameters and operational settings of the HVAC-R system 102 and any other information from the sensor(s) 108. For example, the thermodynamic parameters include, but not limited to, ambient temperature and/or humidity and the operational settings include, but not limited to, defrost schedules of the HVAC-R system 102. In this example, the operational settings of the HVAC-R system 102 are based on a location of the HVAC-R system 102 and usage of the HVAC-R system 102.

The forecasting system 104 may include any computation or communication device that is capable of communicating via the communication network 106. For example, the forecasting system 104 may be a computing or computation device that may be capable of expected energy sample forecasting. The forecasting system 104 may be implemented in a variety of communication devices such as a laptop computer, a desktop computer, a notebook, a workstation, a mobile phone, a personal digital assistant (PDA), and so on.

The communication network 106 may be a wireless network, wired network or a combination thereof. The communication network 106 can be implemented as one of the different types of networks, such as intranet, local area network (LAN), wide area network (WAN), the internet, a metropolitan area network (MAN), an ad hoc network, an intranet, a fiber optic-based network, and/or a combination of these or other types of networks. Additionally or alternatively, the communication network 106 may include a cellular network, the Public Land Mobile Network (PLMN), a second generation (2G) network, a third generation (3G) network, a fourth generation (4G) network (e.g., a long term evolution (LTE) network), a fifth generation (5G) network, and/or another network. The communication network 106 may either be a dedicated network or a shared network, which represents an association of the different types of networks that use a variety of protocols, for example, Hypertext Transfer Protocol (HTTP), Transmission Control Protocol/Internet Protocol (TCP/IP), Wireless Application Protocol (WAP), etc., to communicate with each other. Further the communication network 106 may include a variety of network devices, including routers, bridges, servers, computing devices, storage devices, etc.

In operation, the forecasting system 104 forecasts a first expected energy sample of the HVAC-R system 102 at a first time period by modelling actual energy samples at previous time periods using a statistically-based seasonal-autoregressive integrated moving average (SARIMA) model. For example, the actual energy samples at the previous time periods of the HVAC-R system 102 are obtained from the sensor(s) 108 and/or the database 110. In an embodiment, the forecasting system 104 models the actual energy samples at the previous time periods using the statistically-based SARIMA model that captures temporal correlations of the actual energy samples at the previous time periods.

Further, the forecasting system 104 compares the first expected energy sample with an actual energy sample at the first time period. Furthermore, the forecasting system 104 detects an anomaly at the first time period when deviation between the first expected energy sample and the actual energy sample is greater than a dynamic context sensitive threshold. For example, the dynamic context sensitive threshold is a threshold that is defined based on the location of the HVAC-R system 102, a time-of-day and the thermodynamic parameters at the location.

In addition, the forecasting system 104 forecasts an expected energy sample of the HVAC-R system 102 at next time period by modelling a second expected energy sample of the HVAC-R system 102 at the first time period using the statistically-based SARIMA model upon detecting the anomaly. In an embodiment, the second expected energy sample is an energy sample that is forecasted by modelling the actual energy samples at the previous time periods using a physical model. In this embodiment, the forecasting system 104 obtains thermodynamic parameters and operational settings of the HVAC-R system 102 from the sensor(s) 108 and/or the database 110 and models the actual energy samples at the previous time periods using the physical model by considering the thermodynamic parameters and operational settings of the HVAC-R system 102.

In some embodiments, the forecasting system 104 detects an anomaly at the next time period when deviation between the expected energy sample at the next time period and an actual energy sample is greater than the dynamic context sensitive threshold. In an example embodiment, the forecasting system 104 stores expected energy samples at various time periods and anomaly information in the database 110.

Figure 2:
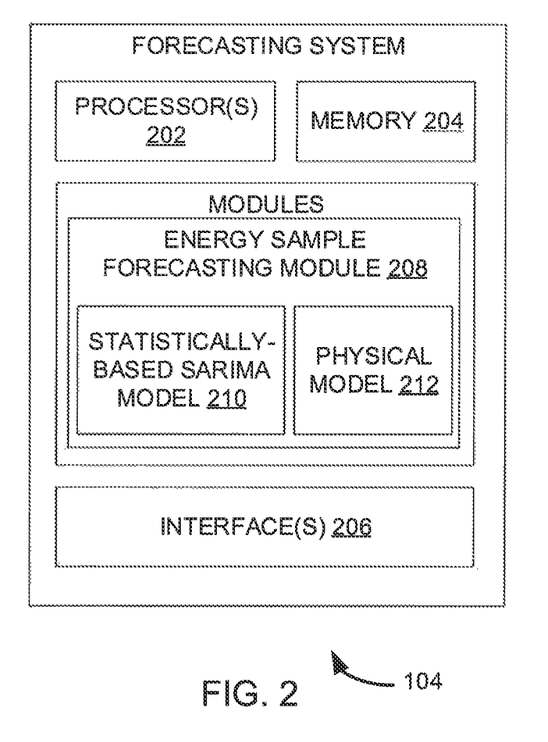
FIG. 2 schematically illustrates a forecasting system, such as the one shown in FIG. 1, according to some embodiments of the present disclosure.

FIG. 2 schematically illustrates the forecasting system 104, such as the one shown in FIG. 1, according to some embodiments of the present disclosure. As shown in FIG. 2, the forecasting system 104 includes one or more processor(s) 202, a memory 204, and interface(s) 206 communicatively coupled to each other. Further, the memory 204 includes an energy sample forecasting module 208. The processor(s) 202, the memory 204, and the interface(s) 206 may be communicatively coupled by a system bus such as a system bus or a similar mechanism. Although FIG. 2 shows example components of the forecasting system 104, in other implementations, the forecasting system 104 may contain fewer components, additional components, different components, or differently arranged components than depicted in FIG. 2.

The processor(s) 202 may include circuitry implementing, among others, audio and logic functions associated with the communication. The processor(s) 202 may include, among other things, a clock, an arithmetic logic unit (ALU) and logic gates configured to support operation of the processor(s) 202. The processor(s) 202 can be a single processing unit or a number of units, all of which include multiple computing units. The processor(s) 202 may be implemented as one or more hardware processors, microprocessors, microcomputers, microcontrollers, digital signal processors, central processing units, state machines, logic circuitries, and/or any devices that manipulate signals based on operational instructions. Among other capabilities, the processor(s) 202 is configured to fetch and execute computer-readable instructions and data stored in the memory 204.

The functions of the various elements shown in the figure, including any functional blocks labeled as "processor(s)", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional, and/or custom, may also be included.

The interface(s) 206 may include a variety of software and hardware interfaces, for example, interfaces for peripheral device(s), such as a keyboard, a mouse, an external memory, and a printer. The interface(s) 206 can facilitate multiple communications within a wide variety of networks and protocol types, including wired networks, for example, local area network (LAN), cable, etc., and wireless networks, such as Wireless LAN (WLAN), cellular, or satellite. For the purpose, the interface(s) 206 may include one or more ports for connecting the forecasting system 104 to a HVAC system or a database (such as the HVAC-R system 102 or the database 110 shown in FIG. 1).

The memory 204 may include any computer-readable medium known in the art including, for example, volatile memory, such as static random access memory (SRAM) and dynamic random access memory (DRAM), and/or non-volatile memory, such as read only memory (ROM), erasable programmable ROM, flash memories, hard disks, optical disks, and magnetic tapes. The memory 204, may store any number of pieces of information, and data, used by the forecasting system 104 to implement the functions of the forecasting system 104. The memory 204 may be configured to store information, data, applications, instructions or the like for enabling the forecasting system 104 to carry out various functions in accordance with various example embodiments. Additionally or alternatively, the memory 204 may be configured to store instructions which when executed by the processor(s) 202 cause the forecasting system 104 to behave in a manner as described in various embodiments. The memory 204 includes the energy sample forecasting module 208 and/or other modules. The module 208 includes routines, programs, objects, components, data structures, etc., which perform particular tasks or implement particular abstract data types. Also, the energy sample forecasting module 208 includes a statistically-based SARIMA model 210 and a physical model 212. The other modules may include programs or coded instructions that supplement applications and functions of the forecasting system 104.

In an embodiment, the energy sample forecasting module 208 train the statistically-based SARIMA model 210 using information from sensor(s) (e.g., the sensor(s) 108 shown in FIG. 1) and/or the database and the time-of-day. The physical model 212 is substantially simultaneously trained using the information from the sensor(s) and/or database, the time-of-day and the thermodynamic parameters. For example, the thermodynamic parameters include, but not limited to, ambient temperature and/or humidity. Further, the energy sample forecasting module 208 obtains the actual energy samples of the HVAC-R system at various time periods (e.g., till time period "t−1") from the sensor(s) or database.

Furthermore, the energy sample forecasting module 208 forecasts the first expected energy sample at a time period "t" by modelling the actual energy samples till time period "t−1" using the trained statistically-based SARIMA model 210. For example, the statistically-based SARIMA model 210 forecasts expected energy samples (i.e., energy consumed) as a regressed function of temporally adjacent samples as well as temporally well-separated samples. In this example, the statistically-based SARIMA model 210 uses temporally adjacent previous energy samples along with temporally well-separated samples (in a seasonal component) to forecast next energy samples and implicitly capture trends that may exist in ambient weather conditions.

Figure 3A:
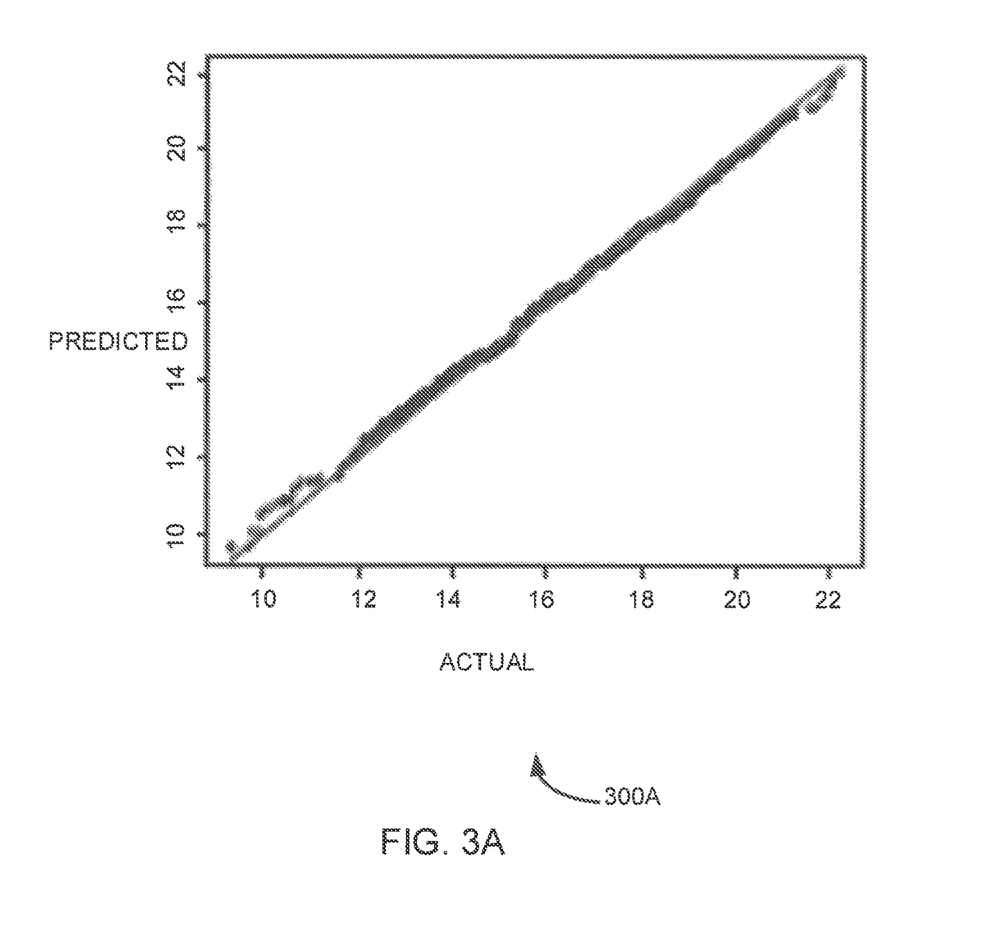
FIG. 3A shows a graph that compares quantiles of an expected and actual energy time-series, according to some embodiments of the present disclosure.

In addition, the energy sample forecasting module 208 compares the first expected energy sample with an actual energy sample at the time period "t", which is obtained from the sensor(s) and/or database. Moreover, the energy sample forecasting module 208 detects an anomaly when deviation between the first expected energy sample and the actual energy sample is greater than a dynamic context sensitive threshold. For example, the dynamic context sensitive threshold is a threshold that is defined based on the location of the HVAC-R system, time-of-day, thermodynamic parameters and the like, FIG. 3A shows a graph 300A that compares quantiles of an expected and actual energy time-series. In the graph 300A, except for upper and lower tails, the expected energy samples matches with the actual energy samples.

Figure 3B:
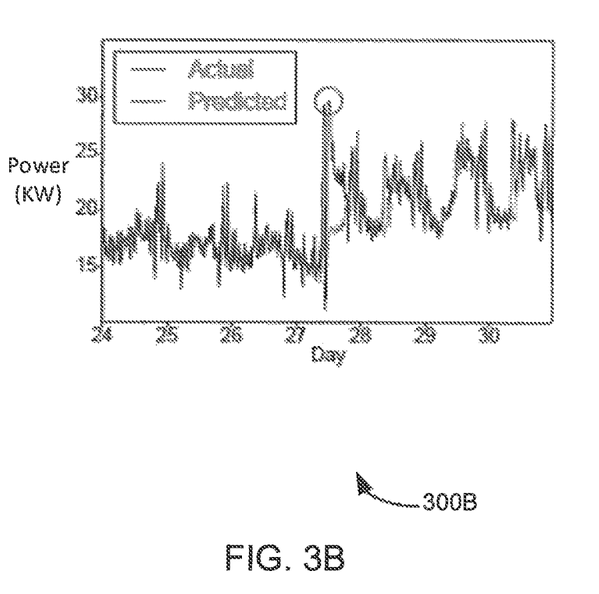
FIG. 3B is a graph illustrating a time-series of energy sample and ambient temperature with an anomalous energy sample being substituted with a physical model forecast for a time-of-day and the ambient temperature, according to some embodiments of the present disclosure.

As the anomalous actual energy sample cannot be used for future forecasts, the energy sample forecasting module 208 forecasts an expected energy sample at a time period "t+1" by modelling a second expected energy sample of the HVAC-R system at the time period "t" using the statistically-based SARIMA model 210. In an example, the second expected energy sample is an energy sample which is forecasted by modelling the actual energy samples at various time periods (till time period "t−1") using the physical model 212. In this example, the physical model 212 considers time-of-day as a parameter, in addition to the thermodynamic parameters, such as ambient temperature and/or humidity for forecasting the second expected energy sample. Accordingly, to forecast an average energy consumption (E) corresponding to a given ambient temperature (T), time-of-day ($t_d$) is first indexed for the forecast and then the ambient temperature (T) to estimate the energy consumption. In other words, the physical model is of a form E ($t_d$, T)=$\phi_{td}$ (T), where $\phi_{id}$ (·) is a regressor that relates the energy consumption and the temperature T at the time-of-day $t_d$. A graph illustrating a time-series of energy and ambient temperature with an anomalous energy sample being substituted with physical model forecast for that time-of-day and ambient temperature is shown in FIG. 3B.

Also, in operation, the energy sample forecasting module 208 detects an anomaly at the time period "t+1" when deviation between the expected energy sample and an actual energy sample, obtained from the sensor(s) and/or database, greater than the dynamic context sensitive threshold. For example, rules for classifying an energy sample as anomalous and hence indicate the onset of a work-order is as follows:

positive outliers: If E(t)>$E_H$, then the sample at t is anomalous and work-order is flagged.
negative outliers: If E(t)<$E_L$, then the sample at t is anomalous and work-order is flagged.
where, $$E(t) = \frac{(E_A(t) - E_P(t))}{E_P(t)}$$

where, $E_A$(t) be an actual energy sample at t and $E_P$(t) is an expected energy sample at t.

Let $E_H$ and $E_L$ respectively denote α-th and (100−α)-th percentile points of distribution of E(t). The value of a (e.g., a value of α is 99.8) is chosen such that $E_H$ corresponds to outliers that are positive (i.e., indicate increased energy consumption) and $E_L$ corresponds to outliers that are negative (i.e., indicate highly reduced energy consumption).

Depending on the impact of the anomaly on operations, the energy consumption may increase or decrease. Specifically, if the anomaly increases (reduces) heat load seen by a compressor in a refrigeration system, it results in higher (lower) energy consumption. Among work-orders, such as leaky refrigerant, malfunctioning EPR valve, iced evaporator, and iced door, the leaky refrigerant shows an anomaly in a lower tail. The other three work-orders, however, show anomalies which are in an upper tail. The EPR valve is the element which throttles refrigerant flow into evaporator coils in the refrigeration system). Thus, a direction of the anomaly can be used to identify the anomaly root-cause to be a subset of the refrigeration system components with some false positive rate (i.e., $$\left(1 - \frac{\alpha}{100}\right)).$$

In some embodiments, the sensor(s) also detects non-energy information that can used for detecting anomalies. In an example, this information can be stored in the database. In these embodiments, the energy sample forecasting module 208 can use the non-energy information from the sensor and the forecasted energy samples to detect anomalies in the HVAC-R system. Using both energy samples and sensor information to identify and classify an anomaly and to find root-cause of the anomaly, a false positive rate is decreased. This is because the energy samples are correlated with the sensor information, especially around true anomalies which allows to fuse two information streams with beneficial results.

FIG. 3B is a graph 300B illustrating a time-series of energy and ambient temperature with an anomalous energy sample being substituted with physical model forecast for a time-of-day and the ambient temperature, according to some embodiments of the present disclosure. Further, the graph 300B shows an effect of correcting energy samples forecasted using the statistically-based SARIMA model by using average physical model forecast energy samples for a given ambient temperature. As shown in FIG. 3B, while the statistically-based SARIMA model starts diverging around a set of anomalous energy samples, because the physical model is used, the statistically-based SARIMA model re-converges to normal operations and the expected energy samples match actual energy samples.

Figure 4:
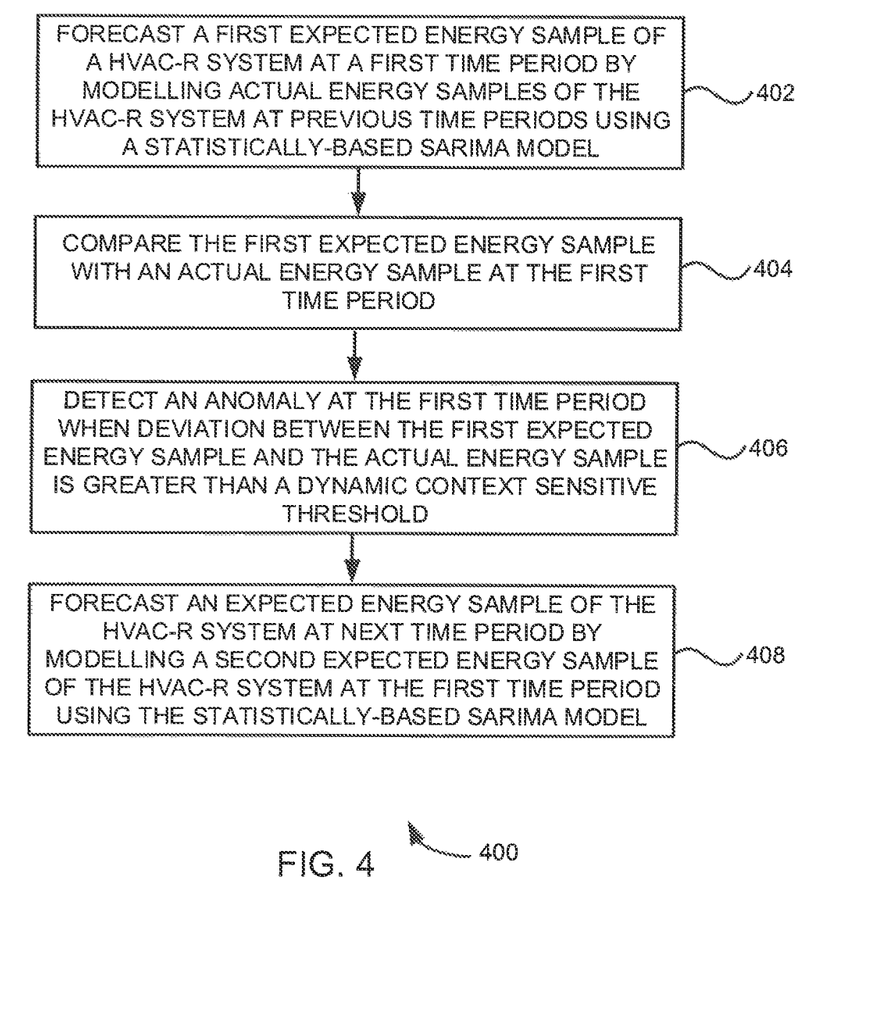
FIG. 4 is a flow chart illustrating a method for energy sample forecasting of a HVAC-R system, according to some embodiments of the present disclosure.

FIG. 4 is a flow chart 400 illustrating a method for energy sample forecasting of a HVAC-R system, according to some embodiments of the present disclosure. At block 402, a first expected energy sample of the HVAC-R system at a first time period by modelling actual energy samples of the HVAC-R system at previous time periods using a statistically-based SARIMA model. In an example embodiment, the actual energy samples at the previous time periods are modelled using the statistically-based SARIMA model that captures temporal correlations of the actual energy samples at the previous time periods.

At block 404, the first expected energy sample is compared with an actual energy sample at the first time period. At block 406, an anomaly at the first time period is detected when deviation between the first expected energy sample and the actual energy sample is greater than a dynamic context sensitive threshold. For example, the dynamic context sensitive threshold is a threshold that is defined based on a location of the HVAC-R system, a time-of-day and thermodynamic parameters. At block 408, an expected energy sample of the HVAC-R system at next time period is forecasted by modelling a second expected energy sample of the HVAC-R system at the first time period using the statistically-based SARIMA model. In an example embodiment, the second expected energy sample is an energy sample which is forecasted by modelling the actual energy samples at the previous time periods using a physical model. In this example embodiment, the actual energy samples at the previous time periods are modelled using the physical model by considering thermodynamic parameters and operational settings of the HVAC-R system. For example, the thermodynamic parameters include, but not limited to, ambient temperature and/or humidity. The operational settings may include, but not limited to, defrost schedules of the HVAC-R system. The operational settings of the HVAC-R system may be based on a location of the HVAC-R system and usage of the HVAC-R system. In some embodiments, the anomaly at the next time period is detected when deviation between the expected energy sample and an actual energy sample at the next time period is greater than the dynamic context sensitive threshold.

The order in which the method(s) are described is not intended to be construed as a limitation, and any number of the described method blocks can be combined in any order to implement the method 400, or an alternative method. Additionally, individual blocks may be deleted from the methods without departing from the spirit and scope of the subject matter described herein. Furthermore, the method 400 can be implemented in any suitable hardware, software, firmware, or combination thereof.

In an implementation, one or more of the method(s) described herein may be implemented at least in part as instructions embodied in a non-transitory computer-readable medium and executable by one or more computing devices. In general, a processor (for example a microprocessor) receives instructions, from a non-transitory computer-readable medium, for example, a memory, and executes those instructions, thereby performing one or more method(s), including one or more of the method(s) described herein. Such instructions may be stored and/or transmitted using any of a variety of known computer-readable media. A computer-readable storage medium refers to any type of physical memory on which information or data readable by a processor may be stored. Thus, a computer-readable storage medium may store instructions for execution by one or more processors, including instructions for causing the processor(s) to perform steps or stages consistent with the embodiments described herein. The term "computer-readable medium" should be understood to include tangible items and exclude carrier waves and transient signals, i.e., be non-transitory. Examples include random access memory (RAM), read-only memory (ROM), volatile memory, non-volatile memory, hard drives, CD ROMs, DVDs, flash drives, disks, and any other known physical storage media.

In various embodiments of FIGS. 1-4, a technique for energy sample forecasting in a HVAC-R system. The proposed technique forecasts expected energy samples by using a statistically-based SARIMA model and a physical model to detect anomalous behavior in an operation of HVAC-R systems. Thus, reducing false positive rates in detecting anomalies. Further, the proposed technique use energy sample along with non-energy information from sensor(s) for reducing the false positive rate while identifying root-cause of an anomaly.

It is, however to be understood that the scope of the protection is extended to such a program and in addition to a computer-readable means having a message therein; such computer-readable storage means contain program-code means for implementation of one or more steps of the method, when the program runs on a server or mobile device or any suitable programmable device.

The illustrated steps are set out to explain the exemplary embodiments shown, and it should be anticipated that ongoing technological development will change the manner in which particular functions are performed. These examples are presented herein for purposes of illustration, and not limitation. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope and spirit of the disclosed embodiments. Also, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items. It must also be noted that as used herein and in the appended claims, the singular forms "a," "an," and "the" include plural references unless the context clearly dictates otherwise.

It is intended that the disclosure and examples be considered as exemplary only, with a true scope and spirit of disclosed embodiments being indicated by the following claims.

What is claimed is:

1. A processor-implemented method comprising:
   forecasting, by one or more hardware processors, a first expected energy sample of a heating, venting and air conditioning-refrigeration (HVAC-R) system at a first time period by modelling actual energy samples of the HVAC-R system at previous time periods using a statistically-based seasonal-autoregressive integrated moving average (SARIMA) model;
   comparing, by the one or more hardware processors, the first expected energy sample with an actual energy sample at the first time period;
   detecting, by the one or more hardware processors, an anomaly at the first time period based on non-energy samples of the HVAC-R system and a deviation between the first expected energy sample and the actual energy sample at the first time period, wherein the deviation between the first expected energy sample and the actual energy sample is greater than a dynamic context sensitive threshold, wherein the dynamic context sensitive threshold is a threshold defined based on a location of the HVAC-R system, a time-of-day and thermodynamic parameters of the location; and
   forecasting, by the one or more hardware processors, an expected energy sample of the HVAC-R system at next time period by modelling a second expected energy sample of the HVAC-R system using the statistically-based SARIMA model upon detecting the anomaly, wherein the second expected energy sample is an energy sample which is forecasted by modelling the actual energy samples at the previous time periods using a physical model.

2. The method of claim 1, further comprising:
   detecting an anomaly at the next time period when deviation between the expected energy sample and an actual energy sample at the next time period is greater than the dynamic context sensitive threshold.

3. The method of claim 1, wherein the actual energy samples at the previous time periods are modelled using the physical model by considering the thermodynamic parameters and operational settings of the HVAC-R system.

4. The method of claim 3, wherein the thermodynamic parameters comprise at least one of ambient temperature and humidity and wherein the operational settings of the HVAC-R system are based on a location of the HVAC-R system and usage of the HVAC-R system.

5. The method of claim 1, wherein the actual energy samples at the previous time periods are modelled using the statistically-based SARIMA model that captures temporal correlations of the actual energy samples at the previous time periods.

6. A system comprising:
a heating, venting and air conditioning-refrigeration (HVAC-R) system, wherein the HVAC-R system comprises:
at least one sensor for detecting actual energy samples of the HVAC-R system; and
a forecasting system communicatively coupled to the HVAC-R system via a communication network, wherein the forecasting system comprises:
at least one processor; and
a memory communicatively coupled to the at least one processor, wherein the memory comprises an energy sample forecasting module to:
forecast a first expected energy sample of the HVAC-R system at a first time period by modelling actual energy samples at previous time periods using a statistically-based seasonal-autoregressive integrated moving average (SARIMA) model, wherein the actual energy samples at the previous time periods of the HVAC-R system are obtained from the at least one sensor;
compare the first expected energy sample with an actual energy sample at the first time period;
detect an anomaly at the first time period based on non-energy samples of the HVAC-R system and a deviation between the first expected energy sample and the actual energy sample at the first time period, wherein the deviation between the first expected energy sample and the actual energy sample is greater than a dynamic context sensitive threshold, wherein the dynamic context sensitive threshold is a threshold defined based on a location of the HVAC-R system, a time-of-day and thermodynamic parameters of the location; and
forecast an expected energy sample of the HVAC-R system at next time period by modelling a second expected energy sample of the HVAC-R system using the statistically-based SARIMA model upon detecting the anomaly, wherein the second expected energy sample is an energy sample that is forecasted by modelling the actual energy samples at the previous time periods using a physical model.

7. The system of claim 6, wherein the energy sample forecasting module detects an anomaly at the next time period when deviation between the expected energy sample and an actual energy sample at the next time period is greater than the dynamic context sensitive threshold.

8. The system of claim 6, wherein the at least one sensor further detects and sends the thermodynamic parameters and operational settings of the HVAC-R system to the energy sample forecasting module.

9. The system of claim 8, wherein the energy sample forecasting module further obtains the thermodynamic parameters and operational settings of the HVAC-R system from the at least one sensor and wherein the energy sample forecasting module models the actual energy samples at the previous time periods using the physical model by considering the thermodynamic parameters and operational settings of the HVAC-R system.

10. The system of claim 8, wherein the thermodynamic parameters comprise at least one of ambient temperature and humidity and wherein the operational settings of the HVAC-R system are based on a location of the HVAC-R system and usage of the HVAC-R system.

11. The system of claim 6, wherein the energy sample forecasting module models the actual energy samples at the previous time periods using the statistically-based SARIMA model that captures temporal correlations of the actual energy samples at the previous time periods.

12. A non-transitory computer readable medium comprising thereon instruction which when executed by a possessor on a computing device, cause the processor to perform a method comprising:
forecasting a first expected energy sample of a heating, venting and air conditioning-refrigeration (HVAC-R) system at a first time period by modelling actual energy samples of the HVAC-R system at previous time periods using a statistically-based seasonal-autoregressive integrated moving average (SARIMA) model;
comparing the first expected energy sample with an actual energy sample at the first time period;
detecting an anomaly at the first time period based on non-energy samples of the HVAC-R system and a deviation between the first expected energy sample and the actual energy sample at the first time period, wherein the deviation between the first expected energy sample and the actual energy sample is greater than a dynamic context sensitive threshold, wherein the dynamic context sensitive threshold is a threshold defined based on a location of the HVAC-R system, a time-of-day and thermodynamic parameters of the location; and
forecasting an expected energy sample of the HVAC-R system at next time period by modelling a second expected energy sample of the HVAC-R system using the statistically-based SARIMA model upon detecting the anomaly, wherein the second expected energy sample is an energy sample which is forecasted by modelling the actual energy samples at the previous time periods using a physical model.

* * * * *